(12) United States Patent
Liao et al.

(10) Patent No.: US 11,156,639 B2
(45) Date of Patent: Oct. 26, 2021

(54) PROBE CARD MODULE

(71) Applicants: Global Unichip Corporation, Hsinchu (TW); Taiwan Semiconductor Manufacturing Co., Ltd., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 58 days.

(21) Appl. No.: 16/794,164

(22) Filed: Feb. 18, 2020

(65) Prior Publication Data

US 2021/0223290 A1    Jul. 22, 2021

(30) Foreign Application Priority Data

Jan. 20, 2020 (TW) .................................. 109101860

(51) Int. Cl.
*G01R 1/04* (2006.01)
*G01R 1/067* (2006.01)
(Continued)

(52) U.S. Cl.
CPC ..... *G01R 1/07342* (2013.01); *G01R 1/07364* (2013.01)

(58) Field of Classification Search
CPC .......... G01R 1/04; G01R 1/067; G01R 1/073; G01R 1/07342; G01R 1/07364;
(Continued)

(56) References Cited

U.S. PATENT DOCUMENTS

| 2006/0255814 A1 | 11/2006 | Eldridge et al. |
| 2009/0061658 A1* | 3/2009 | Hasegawa .......... G01R 1/07371 439/78 |
| 2017/0315149 A1* | 11/2017 | Chen .................. G01R 1/07307 |

FOREIGN PATENT DOCUMENTS

| TW | 200638047 | 11/2006 |
| TW | M528428 | 9/2016 |
| TW | M579279 | 6/2019 |

OTHER PUBLICATIONS

"Office Action of Taiwan Counterpart Application", dated Dec. 25, 2020, p. 1-p. 5.

* cited by examiner

*Primary Examiner* — Neel D Shah
(74) *Attorney, Agent, or Firm* — JCIPRNET

(57) ABSTRACT

A probe card module including a probe card assembly and a strengthening structure is provided. The probe card assembly includes a first surface, a second surface opposite to the first surface, and a plurality of probes protruding from the first surface. The second surface includes a central zone and a peripheral zone surrounding the central zone. Projections of the probes on the second surface are located at the central zone. The strengthening structure is disposed on the second surface and includes two support bases which protrude from the peripheral zone and are away from each other, and the strengthening structure also includes an arc-shaped reinforcement assembly connected to the two support bases, where the arc-shaped reinforcement assembly protrudes toward and leans against the central zone.

10 Claims, 7 Drawing Sheets

(51) Int. Cl.
*G01R 1/073* (2006.01)
*G01R 31/28* (2006.01)
*H01R 12/00* (2006.01)

(58) Field of Classification Search
CPC ................ G01R 31/28; G01R 31/2887; G01R 31/2289; H01R 12/00
See application file for complete search history.

PROBE CARD MODULE

CROSS-REFERENCE TO RELATED APPLICATION

This application claims the priority benefit of Taiwan application Ser. No. 109101860, filed on Jan. 20, 2020. The entirety of the above-mentioned patent application is hereby incorporated by reference herein and made a part of this specification.

BACKGROUND

Technical Field

The disclosure relates to a probe card module, and more particularly, to a probe card module characterized by a good structural strength.

Description of Related Art

During a wafer manufacturing process, different inspections are performed on wafers to ensure the quality of the wafers. A probe card is one of the inspection devices, which contacts bonding pads on a chip through a probe to perform inspection on electrical performance. However, with the advancement of science and technology, the number of to-be-inspected bonding pads on the chip is significant, and the number of corresponding probes may reach 10,000 to 20,000. When the probes press toward the chip, the chip correspondingly withstands huge reaction forces, so that the probe card may be deformed, which poses an impact on the quality of the to-be-inspected bonding pads and the lifespan of the probes.

SUMMARY

The disclosure provides a probe card module, which has better structural strength.

According to an embodiment of the disclosure, a probe card module includes a probe card assembly and a strengthening structure. The probe card assembly includes a first surface, a second surface opposite to the first surface, and a plurality of probes protruding from the first surface. The second surface includes a central zone and a peripheral zone surrounding the central zone. Projections of the probes on the second surface are located at the central zone. The strengthening structure is disposed on the second surface and includes two support bases and an arc-shaped reinforcement assembly. The two support bases protrude from the peripheral zone and are away from each other, and the arc-shaped reinforcement assembly is connected to the two support bases. Here, the arc-shaped reinforcement assembly protrudes toward and leans against the central zone.

In an embodiment of the disclosure, the arc-shaped reinforcement assembly includes at least one arc-shaped body, and each of the at least one arc-shaped body is shaped as an arch bridge, a bowl, a dome, or a hemispherical shell.

In an embodiment of the disclosure, the arc-shaped reinforcement assembly includes a plurality of arc-shaped bodies collectively abutting against the central zone.

In an embodiment of the disclosure, the arc-shaped bodies intersect and lean against the central zone at the intersection.

In an embodiment of the disclosure, the arc-shaped reinforcement assembly includes at least one arc-shaped body in direct contact with the central zone.

In an embodiment of the disclosure, the arc-shaped reinforcement assembly includes at least one arc-shaped body and a sphere. The sphere is rotatably disposed on the at least one arc-shaped body and protrudes from a bottom of the at least one arc-shaped body, and the sphere is located between the at least one arc-shaped body and the central zone and is in direct contact with the central zone.

In an embodiment of the disclosure, the arc-shaped reinforcement assembly further includes an accommodation base, the at least one arc-shaped body includes a first positioning portion, the accommodation base includes a second positioning portion and a groove respectively located at two opposite ends, the second positioning portion of the accommodation base is fixed to the first positioning portion of the at least one arc-shaped body, and the sphere is located at the groove of the accommodation base.

In an embodiment of the disclosure, the arc-shaped reinforcement assembly further includes a gasket disposed between the accommodation base and the at least one arc-shaped body.

In an embodiment of the disclosure, the first positioning portion includes a hole, the second positioning portion includes a protruding pillar, and the second positioning portion is inserted into the first positioning portion.

In an embodiment of the disclosure, the arc-shaped reinforcement assembly is a single arc-shaped body covering the central zone.

Based on the above, in the probe card module provided in one or more embodiments of the disclosure, the strengthening structure is disposed on the second surface of the probe card assembly away from the probes, the arc-shaped reinforcement assembly of the strengthening structure has the design where the central zone of the second surface protrudes toward the probe card assembly, and the arc-shaped reinforcement assembly leans against the central zone (the area with the greatest stress), so as to effectively improve the structural strength of the probe card assembly.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
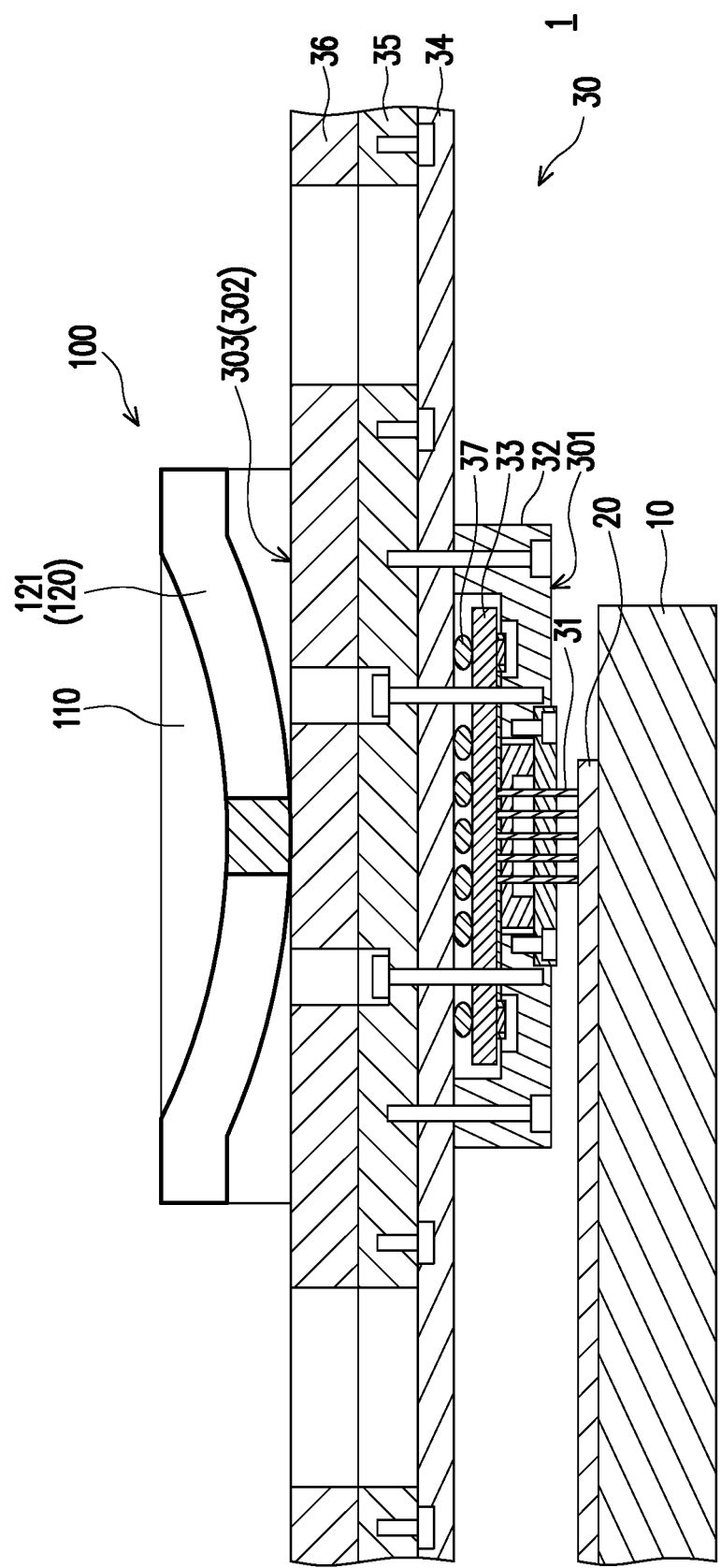
FIG. 1 is a schematic partial cross-sectional view illustrating inspection performed on a wafer by a probe card module according to an embodiment of the disclosure.

FIG. 1 is a schematic partial cross-sectional view illustrating inspection performed on a wafer by a probe card module according to an embodiment of the disclosure. With reference to FIG. 1, in this embodiment, a probe card module 1 includes a probe card assembly 30 and a strengthening structure 100 disposed on a rear side of the probe card assembly 30.

In this embodiment, the probe card assembly 30 includes a plurality of probes 31, a first circuit board 34, a second circuit board 33, a case stand 32, a first plate 35, and a second plate 36. The first circuit board 34 is, for instance, a main circuit board located between the case stand 32 and the first plate 35, and the second circuit board 33 is, for instance, a secondary circuit board located in the case stand 32 and electrically connected to the first circuit board 34 through a solder ball. The probes 31 are disposed at the second circuit board 33 and exposed by the case stand 32. The second plate 36 is disposed on one side of the first plate 35 away from the case stand 32. Certainly, the above description is directed to one kind of the probe card assembly 30, and the types of components in the probe card assembly 30 are not limited to what is described herein.

The probes 31 of the probe card assembly 30 are configured to measure a chip of a wafer 20 placed on a stage 10 to determine whether the chip can operate normally. With the advancement of science and technology, the number of the probes 31 may be arrive at 10,000 to 20,000. When the probes 31 contact the wafer 20, the probe card assembly 30 may withstand a huge reaction force. In this embodiment, the strengthening structure 100 disposed on the rear side of the probe card assembly 30 may effectively prevent the probe card assembly 30 from protruding upward and being deformed by such a large reaction force, and such deformation may pose an impact on the quality of the to-be-inspected bonding pads and the lifespan of the probes 31. Certainly, the number of the probes 31 of the probe card assembly 30 to which the strengthening structure 100 is applied is not limited to the aforesaid number. The strengthening structure 100 is elaborated below.

Figure 2:
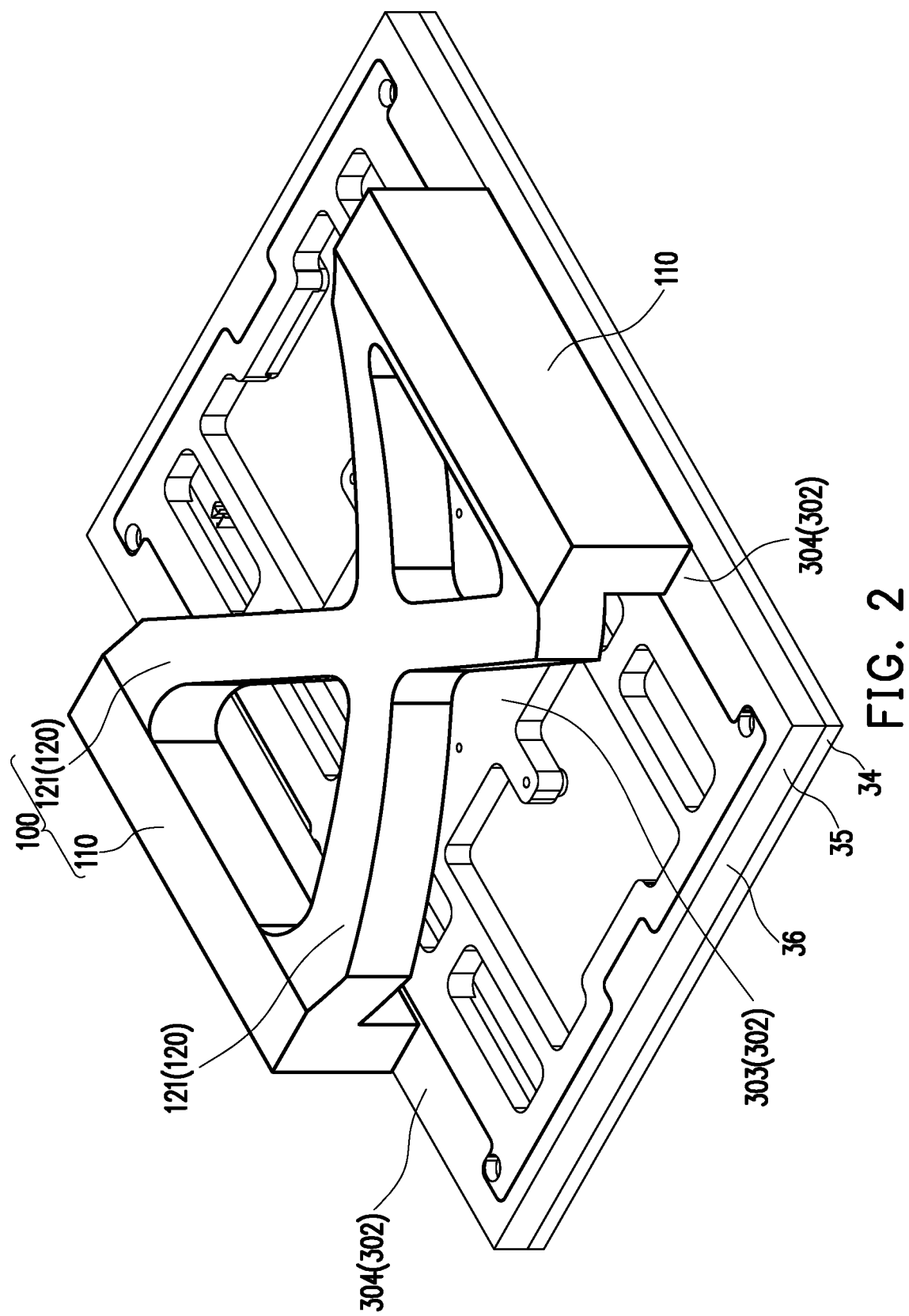
FIG. 2 is a schematic three-dimensional view illustrating the probe card module depicted in FIG. 1.

FIG. 2 is a schematic three-dimensional view illustrating the probe card module depicted in FIG. 1. Please refer to FIG. 1 and FIG. 2 at the same time. In this embodiment, the probe card assembly 30 has a first surface 301 and a second surface 302 opposite to each other. The first surface 301 is, for instance, a lower surface of the case stand 32, and the second surface 302 is, for instance, an upper surface of the second plate 36; however, the locations of the first surface 301 and the second surface 302 are not limited to what is provided herein.

The probes 31 protrude from the first surface 301. The second surface 302 includes a central zone 303 and a peripheral zone 304 (FIG. 2) surrounding the central zone 303. In this embodiment, projections of the probes 31 on the second surface 302 are located at the central zone 303. In addition, it can be observed from FIG. 2 that the strengthening structure 100 is disposed on the second surface 302 and includes two support bases 110 and an arc-shaped reinforcement assembly 120. The two support bases 110 protrude from the peripheral zone 304 and are far from each other, and the arc-shaped reinforcement assembly 120 is connected to the two support bases 110.

In this embodiment, the arc-shaped reinforcement assembly 120 protrudes toward and leans against the central zone 303, and such design may improve the structural strength of the rear side of the probe card assembly 30. When the probes 31 of probe card module 1 contact the wafer 20, the probes 31 withstand the reaction force from the wafer 20. Since the number of the probes 31 may reach 10,000 to 20,000, the sum of all the reaction forces withstood by the probe card module 1 is significant, so that the probe card module 1 may protrude upward and may be deformed. By arranging the strengthening structure 100 on the second surface 302 (the rear side) of the probe card module 1, deformation of the probe card assembly 30 may be effectively avoided, and the lifespan may be extended.

Specifically, the arc-shaped reinforcement assembly 120 includes at least one arc-shaped body 121. In this embodiment, the at least one arc-shaped body 121 includes two arc-shaped bodies 121, but the number of the arc-shaped bodies 121 is not limited thereto. In addition, in this embodiment, each arc-shaped body 121 is shaped as an arch bridge, but in other embodiments, the arc-shaped body 121 may also be in the shape of a bowl, a dome, or a hemispherical shell, given that the arc-shaped body has the arc shape, and the top of the arc leans against the central zone 303.

It can be clearly observed from FIG. 2 that the two arc-shaped bodies 121 in this embodiment intersect, lean against the central zone 303 at the intersection, and collectively abut against the central zone 303. Certainly, in other embodiments, the arc-shaped bodies 121 may not intersect and respectively lean against different regions of the central zone 303. Alternatively, some of the arc-shaped bodies 121 may partially intersect, while the others are not, which should not be construed as being limited to what is depicted in the drawings.

According to a simulation test, the number of the probes 31 is assumed to be 11,000, and one single probe 31 is assumed to withstand 8 grams of force, for instance. As such, the probe card assembly withstands 8 kilograms of force in total. If no strengthening structure 100 is set, the maximum amount of deformation of the conventional probe card assembly is 0.05 mm. In the present embodiment, the maximum amount of deformation of the probe card assembly 30 of the probe card module 1 is 0.014 mm, which indicates that the deformation rate is effectively reduced by 72%. Thereby, the lifespan of the probe card assembly 30 (including the probe 31 and the circuit boards therein) may be extended, and the costs may be further reduced.

Figure 3A:
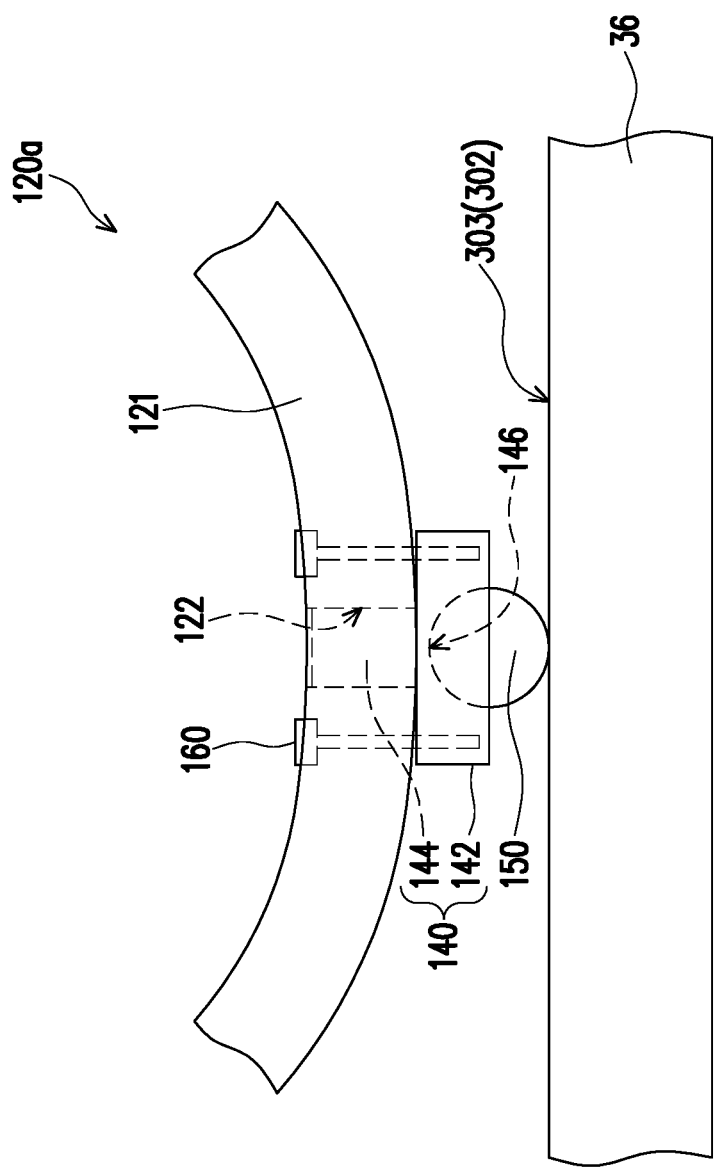
FIG. 3A is a schematic partial side view illustrating a probe card module according to another embodiment of the disclosure.
Figure 3B:
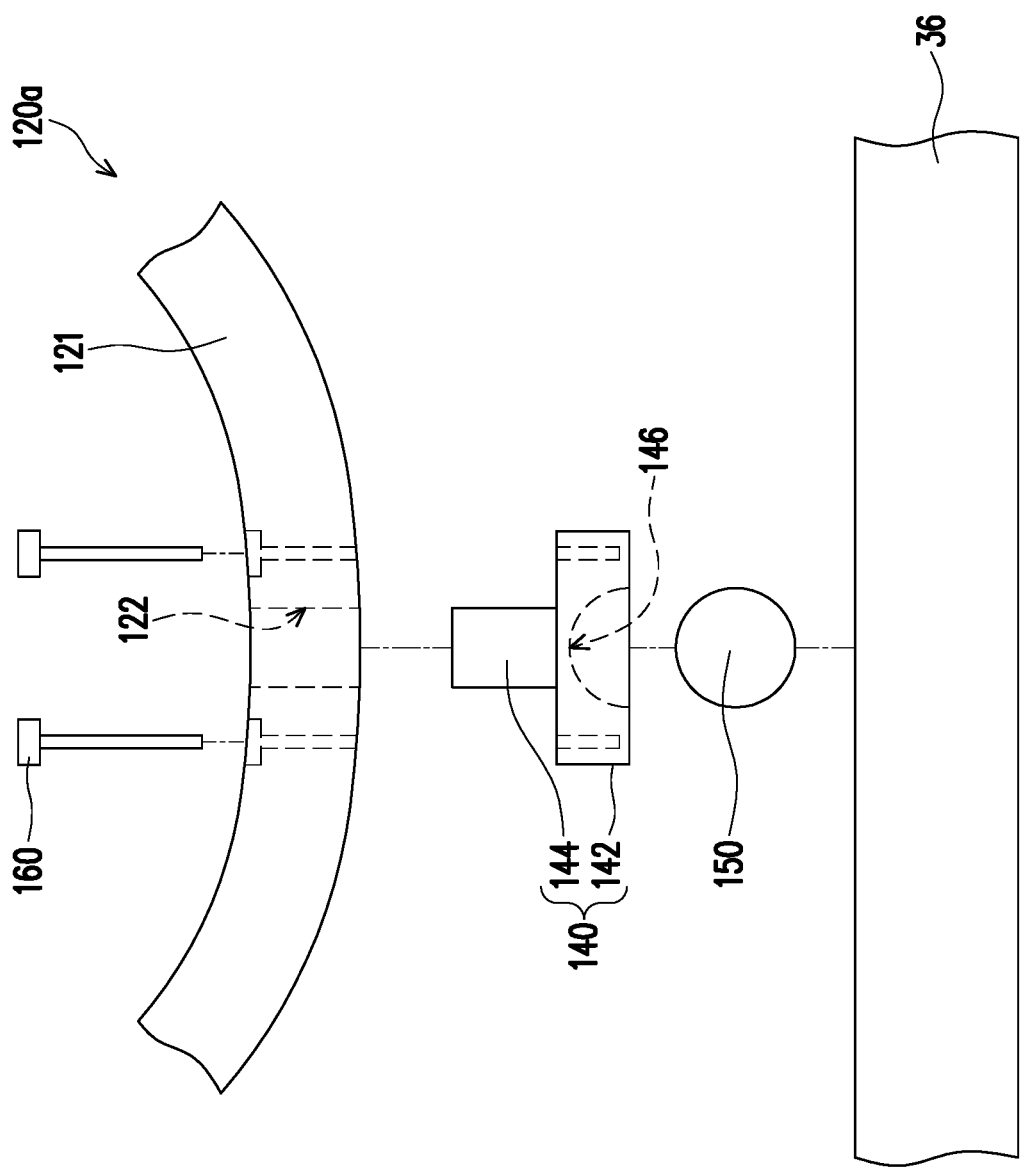
FIG. 3B is a schematic exploded view of FIG. 3A.

In addition, as shown in FIG. 1, the arc-shaped body 121 provided in the embodiment directly contacts the central zone 303 of the second surface 302 of the probe card assembly 30, but the type of the arc-shaped reinforcement assembly 120 is not limited thereto. FIG. 3A is a schematic partial side view illustrating a probe card module according to another embodiment of the disclosure. FIG. 3B is a schematic exploded view of FIG. 3A.

With reference to FIG. 3A and FIG. 3B, in this embodiment, an arc-shaped reinforcement assembly 120a includes at least one arc-shaped body 121 and a sphere 150. The sphere 150 is rotatably disposed at the at least one arc-shaped body 121 and protrudes from a bottom of the at least one arc-shaped body 121. The sphere 150 is located between the at least one arc-shaped body 121 and the central zone 303 and is in direct contact with the central zone 303.

In this embodiment, the arc-shaped reinforcement assembly 120a contacts the central zone 303 through the sphere 150. Since the sphere 150 is rotatable, during the measurement of the wafer 20 by the probe card assembly 30, if the components of the probe card assembly 30 (e.g., the first circuit board 34 or the second circuit board 33 depicted in FIG. 1) are warped to generate a lateral component force, the lateral component force may be released through rotation of the sphere 150, so as to prevent the probe card module 1 from being deformed or subject to size loss due to the lateral force for a long time, which affects the precision.

Further, in this embodiment, the arc-shaped reinforcement assembly 120a further includes an accommodation base 140, the arc-shaped body 121 includes a first positioning portion 122, and the accommodation base 140 includes a main body 142 and a second positioning portion 144 connected to the main body 142. The main body 142 has a groove 146, and the second positioning portion 144 and the groove 146 are located at two opposite ends of the accommodation base 140, respectively.

The second positioning portion 144 of the accommodation base 140 is aligned to the first positioning portion 122 of the at least one arc-shaped body 121, and the accommodation base 140 and the arc-shaped body 121 are fixed to each other by a fixing member 160. In this embodiment, the fixing member 160 is, for instance, a bolt, a latch, or a screw, which should not be limited to what is provided herein. In addition, the sphere 150 is located at the groove 146 of the accommodation base 140 and can be rotated within the groove 146.

In this embodiment, the first positioning portion 122 includes a hole, the second positioning portion 144 includes a protruding pillar, and the second positioning portion 144 is inserted into the first positioning portion 122. The second positioning portion 144 may serve as a stress transfer shaft. Certainly, the types of the first positioning portion 122 and the second positioning portion 144 are not limited to what is provided herein, given that the two positioning portions are well and collaboratively positioned. In an embodiment not shown, the accommodation base 140 may also be omitted, and the groove 146 may be formed below the arc-shaped body 121 to accommodate the sphere 150.

Figure 3C:
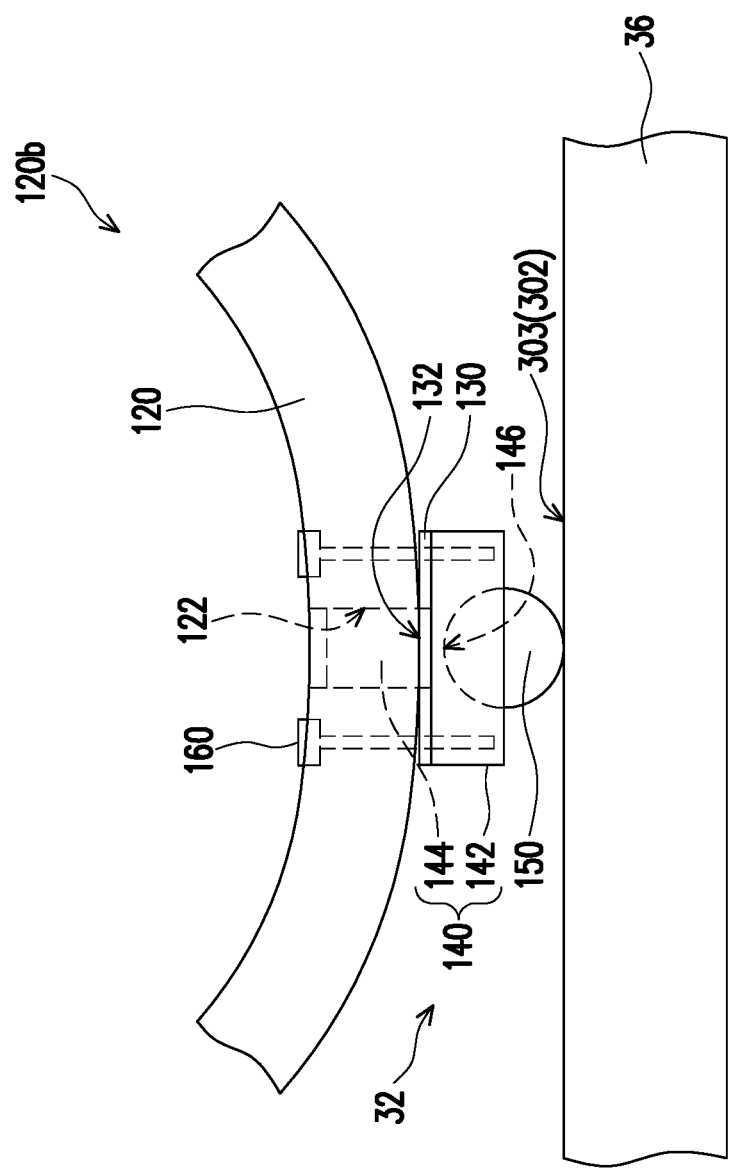
FIG. 3C is a schematic partial side view illustrating a probe card module according to another embodiment of the disclosure.

FIG. 3C is a schematic partial side view illustrating a probe card module according to another embodiment of the disclosure. With reference to FIG. 3C, since the main body 142 of the accommodation base 140 is in contact with the arc-shaped body 121, the main body 142 of the accommodation base 140 may be worn out after the long-term use, and thus a gap may be formed between the main body 142 and the arc-shaped body 121. Thereby, the stress cannot be effectively transferred. In consideration of the above, the arc-shaped reinforcement assembly 120b may optionally include a gasket 130 disposed between the accommodation base 140 and the at least one arc-shaped body 121. The gasket 130 may replace the worn portion of the main body 142 of the accommodation base 140, so that the stress can be transferred smoothly.

Figure 4:
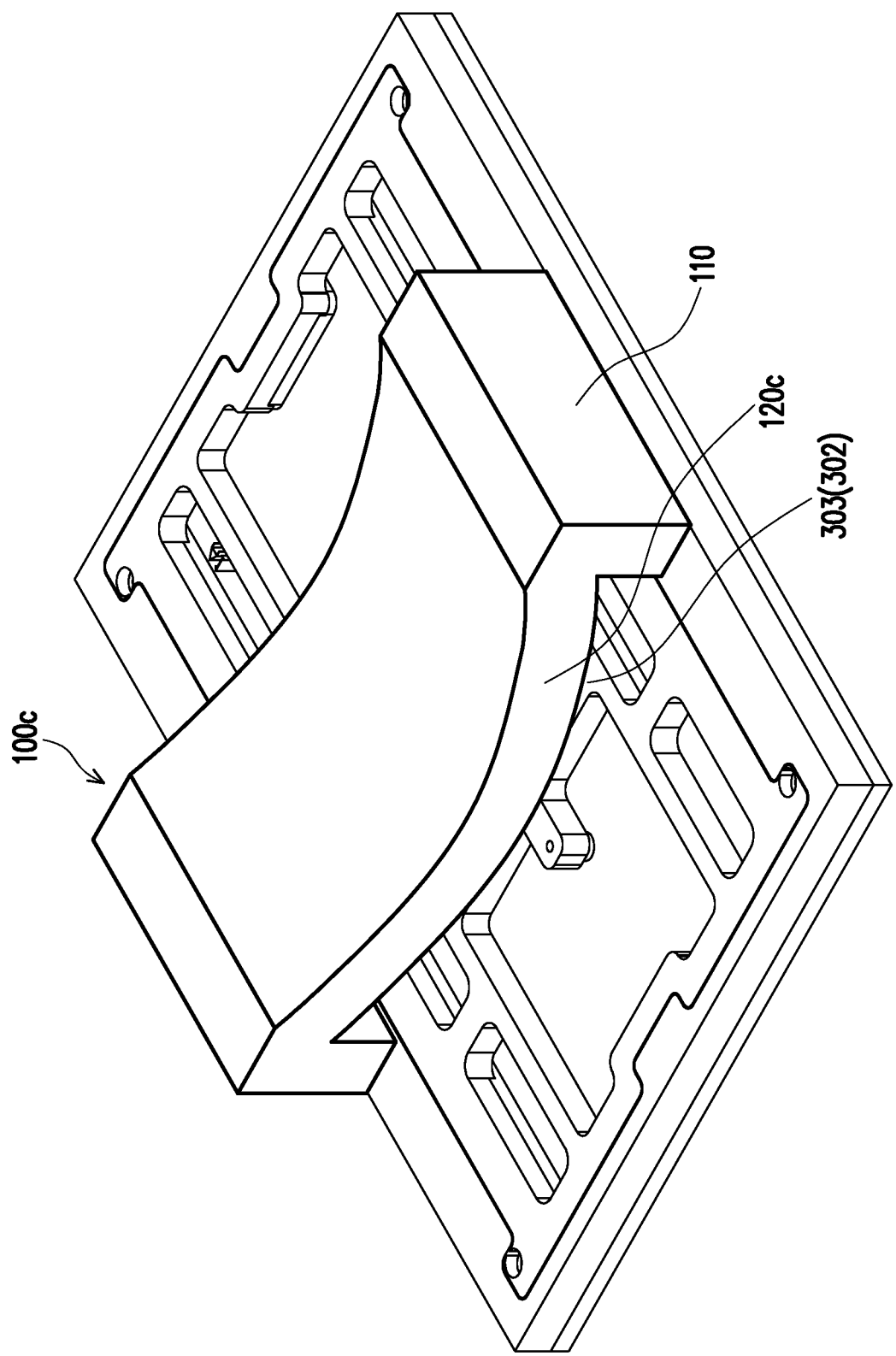
FIG. 4 is a schematic three-dimensional view illustrating a probe card module according to another embodiment of the disclosure.

FIG. 4 is a schematic three-dimensional view illustrating a probe card module according to another embodiment of the disclosure. With reference to FIG. 4, in this embodiment, the arc-shaped reinforcement assembly 120c of the strengthening structure 100c is a single arc-shaped body 121. The width of the arc-shaped reinforcement assembly 120c is large, and the arc-shaped reinforcement assembly 120c covers the entire central zone 303. In other embodiments, note that the arc-shaped reinforcement assembly 120c may cover only a portion of the central zone 303.

Figure 5:
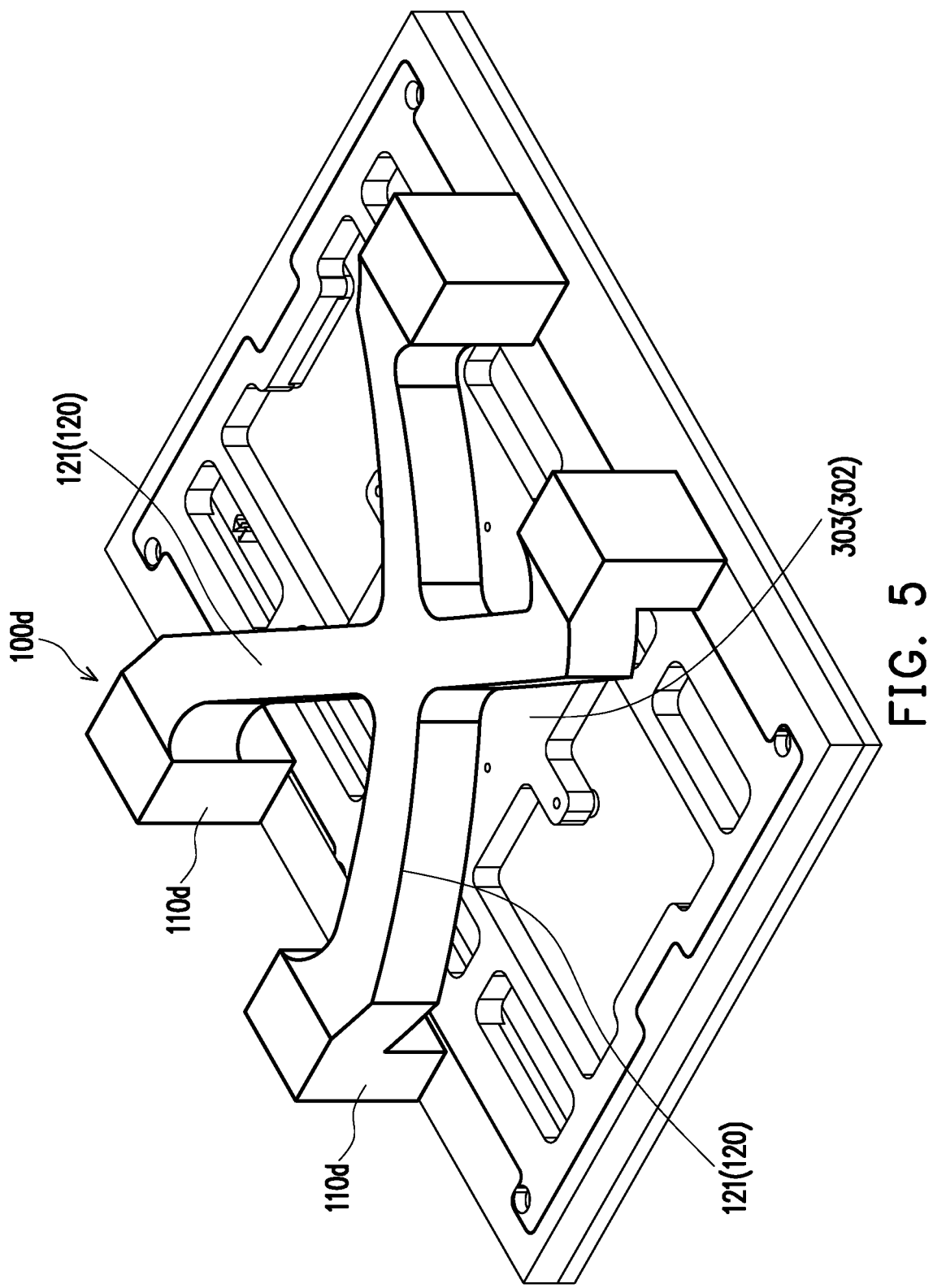
FIG. 5 is a schematic three-dimensional view illustrating a probe card module according to another embodiment of the disclosure.

FIG. 5 is a schematic three-dimensional view illustrating a probe card module according to another embodiment of the disclosure. With reference to FIG. 5, in this embodiment, the strengthening structure 100d has a plurality of separate support bases 110d, and the support base 110d connected to the two ends of one of the arc-shaped bodies 121 is different from the support base 110d connected to the two ends of another arc-shaped body 121. Such design provides more space for configurations of other components.

To sum up, in the probe card module provided in one or more embodiments of the disclosure, the strengthening structure is disposed on the second surface of the probe card assembly away from the probes, the arc-shaped reinforcement assembly of the strengthening structure has the design where the central zone of the second surface protrudes toward the probe card assembly, and the arc-shaped reinforcement assembly leans against the central zone (the area with the greatest stress), so as to effectively improve the structural strength of the probe card assembly. The arc-shaped body of the arc-shaped reinforcement assembly may directly contact the central zone or may contact the central zone through the sphere. Here, the arc-shaped body may be shaped as an arch bridge, a bowl, a dome, or a hemispherical shell, so as to provide good structural strength.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A probe card module, comprising:
   a probe card assembly, comprising a first surface, a second surface opposite to the first surface, and a plurality of probes protruding from the first surface, wherein the second surface comprises a central zone and a peripheral zone surrounding the central zone, and projections of the probes on the second surface are located at the central zone; and
   a strengthening structure, disposed on the second surface and comprising two support bases and an arc-shaped reinforcement assembly, wherein the two support bases protrude from the peripheral zone and are away from each other, the arc-shaped reinforcement assembly is connected to the two support bases, and the arc-shaped reinforcement assembly protrudes toward and leans against the central zone, and
   wherein the arc-shaped reinforcement assembly has a first arc surface and a second arc surface opposite to each other, the first arc surface faces towards the central zone of the second surface, and the second arc surface is away from the central zone of the second surface.

2. The probe card module according to claim 1, wherein the arc-shaped reinforcement assembly comprises at least one arc-shaped body, and each of the at least one arc-shaped body is shaped as an arch bridge, a bowl, a dome, or a hemispherical shell.

3. The probe card module according to claim 1, wherein the arc-shaped reinforcement assembly comprises a plurality of arc-shaped bodies collectively abutting against the central zone.

4. The probe card module according to claim 3, wherein the arc-shaped bodies intersect and lean against the central zone at the intersection.

5. The probe card module according to claim 1, wherein the arc-shaped reinforcement assembly comprises at least one arc-shaped body in direct contact with the central zone.

6. The probe card module according to claim 1, wherein the arc-shaped reinforcement assembly comprises at least one arc-shaped body and a sphere, the sphere is rotatably disposed on the at least one arc-shaped body and protrudes from a bottom of the at least one arc-shaped body, and the sphere is located between the at least one arc-shaped body and the central zone and is in direct contact with the central zone.

7. The probe card module according to claim 6, wherein the arc-shaped reinforcement assembly further comprises an accommodation base, the at least one arc-shaped body comprises a first positioning portion, and the accommodation base comprises a second positioning portion and a groove respectively located at two opposite ends, the second positioning portion of the accommodation base is fixed to the first positioning portion of the at least one arc-shaped body, and the sphere is located at the groove of the accommodation base.

8. The probe card module according to claim 7, wherein the arc-shaped reinforcement assembly further comprises a gasket disposed between the accommodation base and the at least one arc-shaped body.

9. The probe card module according to claim 7, wherein the first positioning portion comprises a hole, the second positioning portion comprise a protruding pillar, and the second positioning portion is inserted into the first positioning portion.

10. The probe card module according to claim 1, wherein the arc-shaped reinforcement assembly is a single arc-shaped body covering the central zone.

* * * * *